US010752185B2

(12) United States Patent
Ette et al.

(10) Patent No.: US 10,752,185 B2
(45) Date of Patent: Aug. 25, 2020

(54) TRANSPORTATION VEHICLE PANEL WITH DISPLAY FUNCTIONALITY

(71) Applicant: VOLKSWAGEN AKTIENGESELLSCHAFT, Wolfsburg (DE)

(72) Inventors: Bernd Ette, Wolfsburg (DE); Andre Morgner, Auerbach (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 0 days.

(21) Appl. No.: 16/157,138

(22) Filed: Oct. 11, 2018

(65) Prior Publication Data

US 2019/0111856 A1   Apr. 18, 2019

(30) Foreign Application Priority Data

Oct. 17, 2017   (DE) .......................... 10 2017 218 516

(51) Int. Cl.

| B60R 13/02 | (2006.01) |
|---|---|
| B60R 13/04 | (2006.01) |
| B60R 11/02 | (2006.01) |
| B60R 25/20 | (2013.01) |
| B62D 25/04 | (2006.01) |
| G06F 3/02 | (2006.01) |
| B60R 11/00 | (2006.01) |

(Continued)

(52) U.S. Cl.
CPC ........ B60R 13/025 (2013.01); B60R 11/0235 (2013.01); B60R 13/0243 (2013.01); (Continued)

(58) Field of Classification Search
CPC ... B60R 13/025; B60R 13/04; B60R 25/2045; B60R 13/0243; B60R 11/0235;
(Continued)

(56) References Cited

U.S. PATENT DOCUMENTS

| 4,190,736 A * | 2/1980 | Warnet ................... H01B 17/02 156/294 |
|---|---|---|
| 4,337,393 A * | 6/1982 | Hilton .................... G07D 11/12 235/487 |

(Continued)

FOREIGN PATENT DOCUMENTS

| DE | 102010013700 A1 | 8/2011 |
|---|---|---|
| DE | 112013005176 T5 | 7/2015 |

(Continued)

OTHER PUBLICATIONS

Search Report for German Patent Application No. 10 2017 218 516.3; dated Jul. 25, 2018.

*Primary Examiner* — Chad M Dicke
(74) *Attorney, Agent, or Firm* — Barnes & Thornburg LLP

(57) ABSTRACT

A transportation vehicle trim with display functionality having a light shade unit with at least one window section which is transparent at least area by area in the visible wavelength area for a transillumination, and a functional unit having at least one illuminant or at least one illuminant and one input unit, wherein the functional unit is formed as a basic module having a self-contained, water-tight housing, in the interior of which the at least one illuminant and the input unit are arranged, wherein the basic module is mechanically connected to the light shade unit. A front side of the housing of the basic module facing a viewing side of the light shade unit may be smaller than an area across which backlit information areas of the transportation vehicle trim extend. Individual light exit areas of the basic module are coupled via light guiding elements to the backlit information areas.

10 Claims, 9 Drawing Sheets

(51) Int. Cl.
*B29L 31/30* (2006.01)
*H03K 17/96* (2006.01)

(52) U.S. Cl.
CPC .......... *B60R 13/04* (2013.01); *B60R 25/2045* (2013.01); *B62D 25/04* (2013.01); *G06F 3/0202* (2013.01); *B29L 2031/3041* (2013.01); *B60L 2250/16* (2013.01); *B60R 2011/0045* (2013.01); *B60R 2011/0047* (2013.01); *B60R 2013/0287* (2013.01); *H03K 17/96* (2013.01)

(58) Field of Classification Search
CPC ..... B60R 2011/0045; B60R 2013/0287; B60R 2011/0047; B60R 2013/028; G06F 3/0202; G06F 3/042; B62D 25/04; G06K 9/209; H03K 17/96; B60L 2250/16; B60L 2031/3041
See application file for complete search history.

(56) References Cited

U.S. PATENT DOCUMENTS

| | | | |
|---|---|---|---|
| 10,001,664 B2* | 6/2018 | Mitani | G02F 1/133305 |
| 10,222,518 B2* | 3/2019 | Nonaka | G02B 5/0242 |
| 10,222,529 B1* | 3/2019 | Cohoon | F21S 41/24 |
| 10,379,265 B2* | 8/2019 | Brown | G02B 5/0278 |
| 2009/0160529 A1 | 6/2009 | Lamborghini et al. | |
| 2012/0032463 A1* | 2/2012 | Gerndorf | B60R 11/0235 296/1.08 |
| 2012/0300135 A1* | 11/2012 | Cho | G02B 6/0021 348/739 |
| 2015/0113842 A1* | 4/2015 | Suhr | A63C 19/00 40/559 |
| 2017/0050616 A1* | 2/2017 | Liubakka | G07C 9/00309 |
| 2017/0139506 A1 | 5/2017 | Rodriguez et al. | |
| 2017/0199610 A1* | 7/2017 | Kitchens, II | G06F 1/3215 |
| 2018/0297331 A1* | 10/2018 | Gahagan | B32B 17/10036 |
| 2018/0374294 A1* | 12/2018 | Farges | G07C 9/00944 |
| 2019/0028813 A1* | 1/2019 | Tomar | B06B 1/0622 |
| 2019/0243053 A1* | 8/2019 | Ono | G02B 6/0036 |

FOREIGN PATENT DOCUMENTS

| | | |
|---|---|---|
| DE | 102016100064 A1 | 7/2017 |
| EP | 3150442 A1 | 4/2017 |
| WO | 2017055886 A1 | 4/2017 |

\* cited by examiner

TRANSPORTATION VEHICLE PANEL WITH DISPLAY FUNCTIONALITY

PRIORITY CLAIM

This patent application claims priority to German Patent Application No. 10 2017 218 516.3, filed 17 Oct. 2017, the disclosure of which is incorporated herein by reference in its entirety.

SUMMARY

Illustrative embodiments relate to a transportation vehicle trim with display functionality, in particular, a light shade, particularly a light shade for a transportation vehicle.

BRIEF DESCRIPTION OF THE DRAWINGS

The disclosed embodiments will be described in more detail below with reference to the figures, in which.

DETAILED DESCRIPTION

Figure 1:
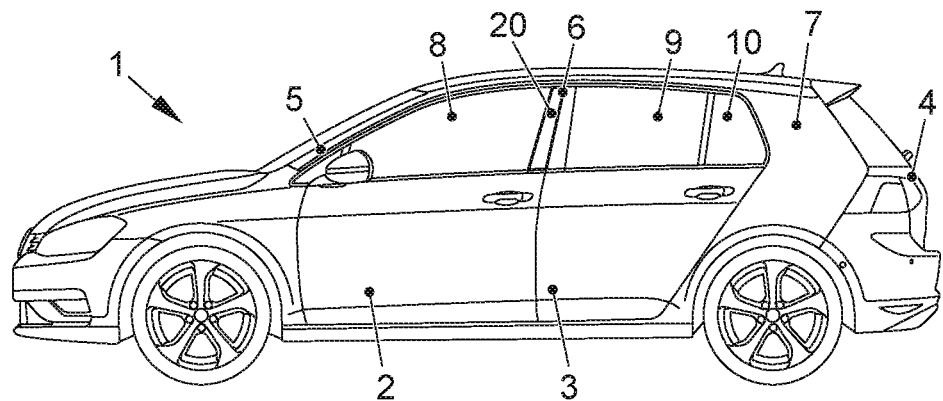
FIG. 1 shows a schematic illustration of a transportation vehicle.

A light shade made of synthetic for a transportation vehicle is known from DE 10 2010 013 700 A1, which comprises a first component made of synthetic and a second component made of synthetic. The first component is at least partially transparent or semi-transparent. The second component has one or several recesses for a display member and/or for an input member. The input member can be a keypad, the keys of which can be operated by finger pressure. A fingerprint sensor is mentioned as alternative.

Such a light shade unit or transportation vehicle trim can be arranged on an A-column, B-column or C-column of a transportation vehicle or in the region of a transportation vehicle door, in particular, in the region of a transportation vehicle door, which covers one of the mentioned transportation vehicle columns. It is further described in the prior art that the display element can be coupled to a keyless go sensor. However, an interactive detection of a user input is only known via an operation by contact. This allows grease and dirt particles to be transferred to the transportation vehicle trim, which impairs an appearance of the transportation vehicle trim and can lead to permanent damage.

A protection against moisture and other environmental influences, for example, for the illuminants of the display unit, is furthermore not satisfactorily solved in the prior art. A housing, which is sealed against a rear side of the light shade, via a circumferential polymer seal, is described in the prior art. Due to temperature changes, in particular, caused by direct solar radiation on the transportation vehicle trim or light shade, respectively, tensions and/or embrittlement, which can lead to a leakage of the sealing material, appear between the different materials.

A touchscreen arrangement is known from US 2009/0160529 A1. An illuminated trim assembly and a perforated component for the trim assembly are known from DE 11 2013 005 176 T5. A transportation vehicle column arrangement comprising a human-to-vehicle interface is known from US 2017/0139506 A1. An input unit for a transportation vehicle is known from WO 2017/055886 A1.

Disclosed embodiments improve the trims for transportation vehicles with display functionality known from the prior art and of eliminating or reducing one or more of the mentioned drawbacks.

Disclosed embodiments provide a transportation vehicle trim.

A transportation vehicle trim with display functionality is created, which comprises a light shade unit comprising at least one window section, which is transparent in the visible wavelength area for a transillumination, as well as a functional unit comprising at least one illuminant and/or an input unit, wherein the functional unit is formed as basic module comprising a self-contained, water-tight housing, in the interior of which the at least one illuminant and/or the input unit are arranged. One benefit is that all functional units, which include electrical or electronic components, are arranged in the basic module, which is sealed against water. The housing may be made and welded of a synthetic material, in particular, a thermoplastic synthetic material.

Such a transportation vehicle trim can be used in areas in which the light shade itself does not need to be sealed completely against other transportation vehicle parts. Due to the fact that the transportation vehicle trim does not comprise any further electrical or electronic functional components in addition to the basic module, the other components do not need to be embodied to be water-tight.

The otherwise completely surrounded and laser-welded housing can comprise an air exchange element, provided that larger hollow spaces are present in the interior, to avoid condensation in the interior. An air exchange element can be formed, for example, with the help of a membrane, for example, made of expanded polytetrafluoroethylene (ePTFE). The basic module, however, may be constructed in such a way that no or virtually no hollow spaces are created in the interior and the housing can be sealed and welded completely hermetically via the synthetic material of the housing.

In the case of at least one disclosed embodiment, a light guiding module is arranged between the light shade unit and the basic module, wherein the light guiding module has at least one recess for forming a backlightable information area, wherein the at least one recess is overlapped by the window area of the light shade unit or coincides with a part of the window area, so that light irradiated into the recess can pass through the light shade unit in response to the backlighting.

The information, which is transferred to a transportation vehicle user, is usually determined by an information element or symbol element, which comprises opaque and transparent areas and covers or overlaps the recess of the information area, wherein the transparent areas determine backlightable information of the information area of the respective recess. If a number of recesses is formed in the light guiding module, they are optically isolated from one another, i.e., light, which is irradiated into a recess and thus an information area for the backlighting, does not enter into other recesses or information areas.

The information element, which is also called symbol element, because the information is frequently displayed as a symbol, can, for example, also be formed on or in the light guiding module or also in the light shade unit.

The light guiding module may be produced separately from the light shade unit and is connected to the latter. The light guiding module is, for example, coupled to the light shade unit via a detent connection. A flexibilization is hereby attained, because information to be conveyed and/or an embodiment of the information area or areas is not directly connected to the basic module.

The basic module and/or the light guiding module or alternatively the basic module and the light shade unit may be also formed with coupling methods or mechanisms, so that the basic module can be arranged on a light guiding module or alternatively the basic module can be arranged on the light shade unit by a detent connection. The basic module can also be fastened to the light shade unit as well as to the light guiding module.

A compact construction of the basic module is made possible in that the basic module has at least one light exit area, from which the light of the at least one illuminant exits from the basic module, and the basic module is arranged on the light guiding module in such a way that the at least one light exit area does not overlap with the at least one recess, which forms the at least one information area for a backlighting through this illuminant, and at least one light guiding element is formed in the light guiding module, which guides the light, which exits from the at least one light exit area of the basic module, to the backlightable information area of the at least one recess. A surface on the transportation vehicle trim, which is available and used for the display, can thus be embodied to be very much larger than a surface of the basic module, which faces the viewing side of the transportation vehicle trim. This creates the possibility to embody the basic module to be so compact that it does not require an air exchange unit.

In the case of at least one disclosed embodiment, a front side of the basic module facing the light shade unit has a smaller surface than the surface of the area of the light shade unit, which covers the backlightable information areas, wherein at least one light guiding element guides light exiting from the basic module at a light exit area to one of the backlightable information areas.

The transportation vehicle trim may be formed in such a way that, in addition to the at least one recess, which forms the at least one information area, the light guiding module has further recesses, which form further information areas for a backlighting, the basic module has further light exit areas, to each of which an individually controllable illuminant is assigned, and further light guiding elements, which are optically isolated from one another and from the at least one light guiding element, are formed in the light guiding module, to guide the light exiting from one of the further light exit areas to one of the further information areas in each case. In the case of such a disclosed embodiment, a variety of information, for example, as symbols can in each case be backlit systematically and thus convey information to a user. A size of the basic module does not need to be changed or only insignificantly hereby, so as to be able to accommodate a sufficient number of illuminants and so as to provide individual light exit areas, which are assigned to the illuminants.

In the case of some disclosed embodiments of the transportation vehicle trim, it is provided that the basic module comprises at least one additional individually controllable illuminant, the light of which exits from an additional light exit area in response to a control, and the light guiding module has at least one additional recess for forming at least one additional information area, wherein the at least one additional recess and the at least one additional light exit area overlap in the case of an arrangement of the basic module on the light guiding module, so that light exiting from the at least one additional light exit area directly backlights the at least one additional information area. The possibility to save at least one light guiding element and to use a direct backlighting of an information area is hereby created.

However, all information areas can also be backlit via a light guiding element.

An information or symbol element can, for example, be formed as opaque layer with one or several transparent areas. The shape of the one transparent area or the shapes of the several transparent areas hereby determines/determine the information, which can be perceived in response to a backlighting.

The at least one opaque layer can be part of a basic body of the light guiding module, which may be made of an opaque synthetic material, optionally of an opaque thermoplastic synthetic material. The opaque layer can thus be a material layer, which spans the recess of an information area, in which the one or the several transparent areas are, for example, formed as opening or openings. Alternatively, the information element or symbol element can be formed by a film, which covers an information area of the recess and which comprises opaque and transparent areas, wherein the transparent areas again display the information, which can be perceived in response to the backlighting, for example, one or several symbols.

In the case of at least one disclosed embodiment, the light guiding module is formed in such a way that it has an accommodation for a film, which covers several or all of the recesses forming an information area. It hereby becomes possible to produce the light guiding modules in large quantity and to individually individualize the symbols or information, respectively, which are displayed in the individual information areas, via an introduction of one or several films in a simple manner.

A further possibility to determine the information or the symbol, respectively, which can be perceived in an information area, is to structure the light guide in the area of the information area in such a way that light exit areas of the light guiding element determine the information, which can be perceived in response to a light guiding through the light guiding element.

At least one disclosed embodiment provides that the information elements or symbol elements are formed by an opaque coating on a rear side, i.e., the side of the light shade unit facing away from the viewing side. The opaque coating has transparent or translucent areas for forming the information or pieces of information. Light can pass through the light shade unit at these translucent or transparent locations in response to the backlighting. Except for the coating, the light shade unit is transparent for a backlighting in the at least one visible wavelength in that area, in which the information is formed via transparent and translucent recesses in the opaque coating. This area is thus still referred to as window area, even when partial areas of the light shade unit is non-transparent due to the coating, where it does not have transparent or translucent apertures or recesses. The window area of the light shade unit thus has to be transparent for the backlighting at least section by section or area by area for at least one visible wavelength area. Except for an opaque coating possibly formed on the side facing away from the viewing side, the light shade material in the window area is thus usually transparent for the transillumination for at least one visible wavelength area.

The opaque coating can, for example, be imprinted, sprayed on or be formed in another way.

In the case of some disclosed embodiments, the light shade unit can thus be transparent at least area by area in the window area, in the case of others even completely transparent for the transillumination in at least one visible wavelength area of the light.

A further significant improvement as compared to the prior art, in particular, to achieve an interactive use of the display functionality, is created in that the basic module comprises a gesture recognition sensor, which works without contact, as input unit.

One benefit of a gesture recognition sensor, which works without contact, is that a mechanical and also chemical impairment of the transportation vehicle trim is significantly reduced or is completely eliminated, respectively, in response to a user interaction. To carry out such a no-contact gesture recognition, it is provided in the case of at least one disclosed embodiment that the basic module comprises an infrared transmitter and an infrared receiving sensor as sensor elements, to hereby carry out distance measurements in a detection area upstream of the light shade unit.

The light shade unit may be made of a material, which is transparent for the infrared radiation of the infrared transmitter and the spectral detection area of the infrared receiving sensor. If an opaque coating is formed on the rear side of the light shade unit, i.e., on the side facing away from the viewing, optionally for forming information elements, the coating has a recess or recesses or an aperture or apertures, respectively, at least in the area of the sensor elements, i.e., at the location where the light shade unit covers the sensor elements, or in a slightly larger area around this, so that the light shade unit is transparent in this area for the radiation, which the sensor elements send or receive, so that a slight weakening and/or scattering of this radiation occurs in the light shade unit.

To minimize a weakening of the emitted infrared radiation as well as of the detected infrared radiation, it is provided in the case of at least one disclosed embodiment that the light guiding module arranged between the light shade unit and the basic module has recesses for the corresponding sensor elements.

The sensor elements are arranged in the basic module and are integrated in the latter in such a way that they protrude from a basic module side surface, in particular, the front side, and engage with the recesses of the light guiding module, which are formed for the sensor elements.

The surfaces of the sensor elements, which face the light shade unit, may be embodied to be dark, in particular, black, or in the same color as the light guiding module. It can hereby be attained that the sensor elements do not negatively influence an optical appearance of the transportation vehicle trim and cannot or can only barely be perceived from a viewing side of the light shade unit.

To nonetheless provide for a localization possibility of the gesture recognition sensor for the user, the sensor elements in the case of at least one disclosed embodiment are arranged between two recesses, which are backlightable information areas.

In the case of at least one disclosed embodiment, the infrared receiving sensor is formed to detect reflected infrared radiation in a directionally and/or spatially resolved manner. Disclosed embodiments are provided in which the infrared radiation reflected onto the infrared receiving sensor from different directions is displayed on different detection elements by an optical system. A plurality of light intensity and/or light propagation time measurements can hereby be carried out iteratively simultaneously or with a time delay by a pulsed infrared light source as infrared transmitter, and a large spatial area upstream of the light shade unit can thus be analyzed with regard to a presence and/or movement of an operating element, for example, a body part of a user. Position changes as well as an expansion of the operating element can be evaluated reliably and quickly. It hereby becomes possible that a variety of gestures, both static gestures, which are associated, for example, with a certain hand posture or a presence of the operating element in a certain spatial area, and/or dynamic gestures, which are linked to a movement of an operating element relative to the gesture sensor, are evaluated and used.

To increase a conveying of information in an information area, it may be provided that the corresponding illuminant is a multi-color illuminant, which can systematically emit differently colored light.

The illuminants may be formed as LEDs. To attain a polychromy, the illuminants may be formed as RGB-LEDs, which can create light of a different color, for example, red, green and blue light. It is likewise possible to assign different individually controllable illuminants, which each emit only light of a certain color or certain colors, to a light exit area of the basic module. Different colored backlighting of an information area can also be attained with this via a color addition, provided that a light intensity of the different illuminants can be controlled individually.

All of the illuminants may control the light intensities of the light emission individually and gradually.

The light shade unit may be formed with a closed surface. Optionally, this surface may be smooth and shiny.

Optionally, the transportation vehicle trim may have a color, which is as uniform as possible, optionally dark, when none of the information areas is backlit.

In the case of at least one disclosed embodiment, it is thus provided that the light shade unit additionally comprises an opaque area in addition to the window area. The light shade unit is produced, for example, in a two-component or multi-operation injection molding or injection compression molding process.

The light shade element can further be made of an acrylic glass, for example, polymethyl methacrylate (PMMA). Disclosed embodiments, which appear dark or black in incident light, but which have a sufficient transmission for a backlighting in transmitted light, are known in the prior art.

In the case of at least one disclosed embodiment, the light guiding module can also be produced as separate part in a multi-operation injection molding or injection compression molding process.

In a disclosed embodiment, the light guiding elements each have a transparent or translucent core, optionally made of a synthetic material. The light guiding can take place based on different physical effects. On the one hand, the transparent or translucent core can be sheathed by a material, which has a smaller optical refractive index than the core material. The possibility is hereby created the light, which strikes against the boundary surface between the core material and the sheathed material at an obtuse angle, is guided via total reflection at the boundary surfaces inside the core material.

A light guiding in the transparent or translucent core material is possible as well, if it is surrounded by a reflective sheath and the light guiding takes place by specular reflection on the sheath. Alternatively or in addition to the light guiding by total reflection or specular reflection at the sheath or the boundary surface to the sheath, respectively, the core material can have scattering centers and the light guiding can take place via diffuse scattering in the light guide. The light guiding in a light guide can also take place section by section according to different physical modes of action.

In addition to the recesses, which define the information areas and have a symbol element or an information element, still further recesses can also be formed in the light guiding module, which are connected directly or via still further light guiding elements to still further light exit areas of the basic module, wherein the still further recesses do not have any information element or symbol elements. A backlighting predominantly serves the purpose of directing the attention, i.e., a viewing direction of a user. If the information elements are formed in an opaque coating of a light shade unit, which is otherwise transparent in the window area for the transillumination with visible light, an aperture or several apertures or recesses are present in the opaque coating, which cover the still further recesses of the light guiding module and form one or several transparent areas in the opaque coating.

A side view of a transportation vehicle 1 is illustrated schematically in FIG. 1. A left transportation vehicle side comprising a front transportation vehicle door 2 and a rear transportation vehicle door 3 can be seen. The transportation vehicle further has a tail gate 4. A front and rear transportation vehicle door on the opposite transportation vehicle side are not illustrated. The transportation vehicle has a so-called A-column 5, a B-column 6, and a C-column 7. Transportation vehicle trims, for example, for creating an esthetic external view and/or for covering technical equipment located therebelow, are used on these various transportation vehicle columns, but also at other locations. Adjoining a side window 8, 9, 10, transportation vehicle trims can be used on the edge to cover a frame. In the illustrated exemplary embodiment, a transportation vehicle trim 20 with display functionality is formed as part of the B-column trim on the front left transportation vehicle door 2. Alternatively or in addition, a transportation vehicle trim with display functionality could also be formed as part of the B-column trim, for example, in the rear transportation vehicle door 3. Other disclosed embodiments provide that the transportation vehicle trim is not part of one of the transportation vehicle doors, but is used as trim in an immovable transportation vehicle body part.

Figure 2:
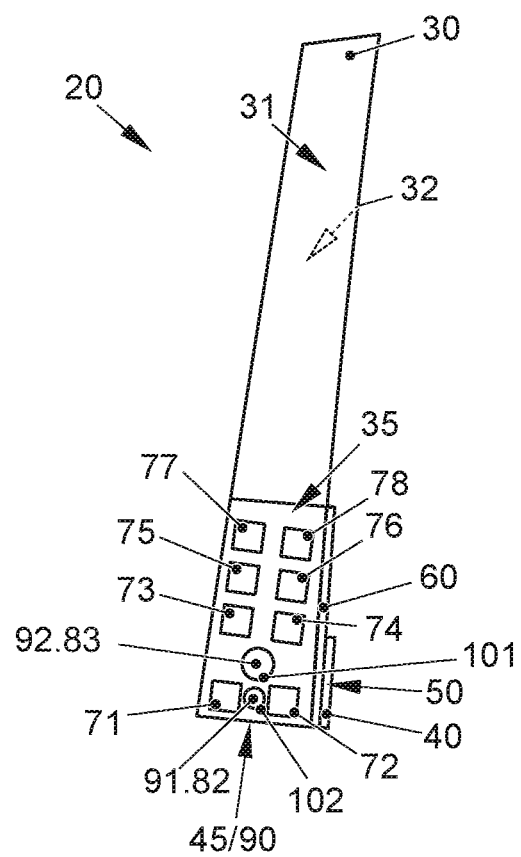
FIG. 2 shows a schematic view of a transportation vehicle trim.

A schematic view of a transportation vehicle trim 20 with display functionality is illustrated in FIG. 2. Identical technical features are identified with the same reference numerals in all figures. The transportation vehicle trim 20 comprises a light shade unit 30, which has a viewing side 31, which faces a user. A rear side 32, which faces the transportation vehicle component, on which the transportation vehicle trim 20 is arranged, is located opposite the viewing side 31.

A light guiding module 60 is arranged between a functional unit 40, which is formed as basic module 50, on the rear side 32 of the light shade unit 30. In the illustrated embodiment, the light guiding module 60 comprises information areas 71-78. Every information area may have an information or symbol element 81-88. The information or symbol element 81-88 determines that information for the corresponding information area 71-78, for example, a symbol, which can be perceived by an observer in response to an illumination or backlighting, respectively.

The symbols are illustrated schematically here as Roman numerals I to VIII in an exemplary manner. Such an information element, also called symbol element 81-88, may be formed across areas of different transmission. Optionally, opaque non-transparent and transparent or translucent areas exist. One form of the transparent and translucent areas then determines the information, for example, a symbol or symbols, which can be detected accordingly in the information area 71-78 in response to an illumination or backlighting.

To be able to perceive the corresponding information of one of the information areas 71-78, the light shade unit 30 has, at least in that area, in which the information areas 71-78 of the light guiding module are arranged, a window area 35, in which the light shade unit 30 is transparent at least area by area for a transillumination with light.

Information elements or symbol elements can be formed in the light guiding module 60 or information on the rear side 32 of the light shade unit 30. If the information elements or symbol elements are formed in the light guiding module 60, the window area 35 may be completely transparent for a backlighting with visible light. If the symbol elements or information element 81-88 are formed across transparent or translucent areas in an opaque coating of the rear side 32 of the light shade unit 30, the window area 35 is transparent section by section or area by area for the backlighting with visible light.

On a side 32 facing away from the viewing side 31 of the light shade unit 30, the functional unit 40 is arranged, which comprises one or several illuminants (not illustrated), which can create perceivable information via a backlighting on the viewing side 31 of the light shade unit. This may take place in that the symbol or information elements 81-88 are illuminated or backlit. In the illustrated embodiment, they are formed in a light guiding module 60, which is arranged between the functional unit 40 and the light shade unit 30.

Due to the fact that a transportation vehicle trim 20 with display functionality is arranged on the outside of a transportation vehicle body, the transportation vehicle trim is subjected to environmental influences, in particular, wetness and moisture. Functional elements, which belong to the functional unit 40, such as, for example, illuminants and/or detection sensors of an input unit, which comprise sensitive, mostly electronic components, need to be protected against moisture. In the case of the solution proposed here, the functional elements, such as illuminants and sensors, are arranged in the basic module 50, which has a water-tight housing 59, which is completely enclosed. This basic module 50 is arranged downstream from the light shade unit 30 and is fastened directly to the light shade unit 30 or to the light guiding module 60 arranged between the light shade unit 30 and the basic module 50. A fastening to the light shade unit 30 and/or to the light guiding module 60 may take place via a detent or snap-connection. Provided is a simpler assembly and a possibility to be able to separate the individual parts from one another in a destruction-free manner in response to a service.

In addition to the illuminants, the functional unit 40 may comprise an input unit 45, which can detect user inputs without contact. In the case of the exemplary embodiment illustrated in FIG. 2, the functional unit 40 or the basic module 50, respectively, comprises a gesture recognition sensor 90 as input unit 45, which has an infrared transmitter 93 and an infrared receiving sensor 94 as sensor elements 91, 92. These two are also formed downstream from the light shade unit 30 and in the basic module 40 and are enclosed and integrated by the housing thereof. So as not to impact the mode of operation of the gesture recognition sensor 90, functional recesses 101, 102 are formed in the light guiding module 60. The sensor elements 91, 92, i.e., the infrared transmitter 93 and the infrared receiving sensor, may be arranged in protrusions of the basic module so that they engage with and through the functional recesses 101 and 102 of the light guiding module 60. The light shade unit 30 is transparent at least in the area of the functional recess 101, 102, optionally in the entire window area 35, for infrared radiation, which the gesture recognition sensor 90 uses. The light shade unit 30 overlaps the functional recesses 101, 102.

Figure 3:
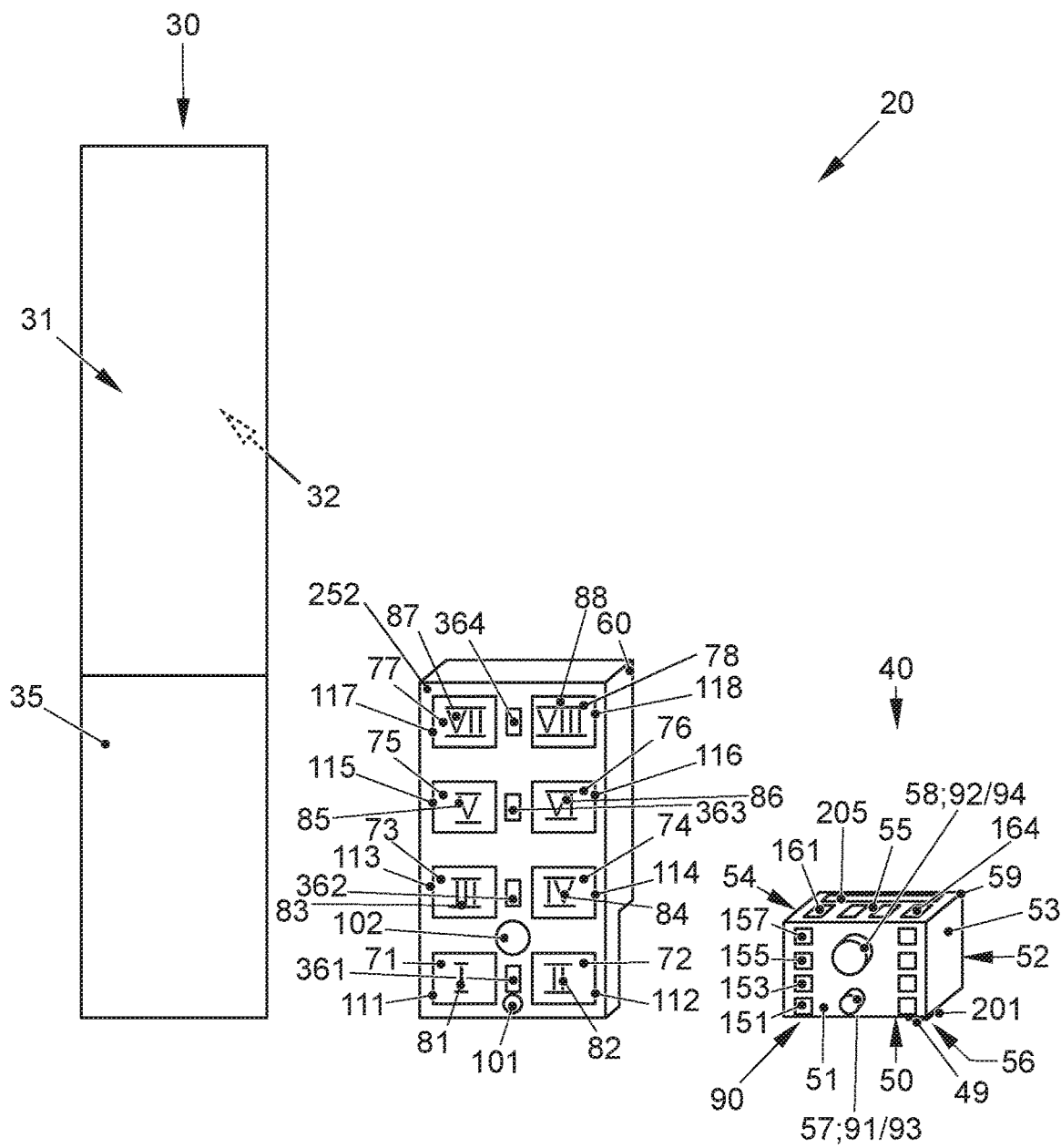
FIG. 3 shows a schematic exploded view of a transportation vehicle trim, consisting of a light shade unit, a light guiding module, and a functional module formed as basic module.

An exploded view of a transportation vehicle trim 30 with display functionality and user input detection functionality is illustrated schematically in FIG. 3. Embodiments are also conceivable, in the case of which the input functionality is not formed. It can be seen well in FIG. 3 that the transportation vehicle trim 20 comprises three functional components, the light shade unit 30, the light guiding module 60, and the functional unit 40, which is formed as basic module 50.

The light shade unit 30 may be made of a synthetic material, optionally a thermoplastic synthetic, in particular, of polymethylmethacrylate (PMMA), which is also referred to as acrylic glass, which is traded, for example, under the trade names PLEXIGLAS®, ACRYLITE®, LUCITE® or PERSPEX®.

Depending on the embodiment, this can be completely transparent and clear or transparent and colored in the visible wavelength area. It is likewise possible to form PMMA in an opaque manner.

Exemplary embodiments of acrylic glass have a dark, virtually black appearance in incident light, but have a noteworthy transmission for a transillumination, so that a display of backlit symbols and information is possible by such an embodiment of the acrylic glass.

The light shade unit 30 has at least one window area 35, which has a sufficient transmission for a transillumination in the visible wavelength area. In this window area 35, the light shade unit 30 is permeable in both transmission directions for infrared radiation, which is used by the gesture recognition sensor 90.

The viewing side 31 may be provided with a surface, which is formed to be smooth or shiny. Other embodiments can also have a matte surface in areas which do not belong to the window area 35.

The basic module 50 has a front side 51, which faces a rear side 32 of the light shade unit 30 in the assembled state. In the case of the illustrated embodiment, the basic module 50 has, on the front side 51, light exit areas 151-158, the number of which may correspond to a number of information areas 71-78 of the light guiding module 60. At least one illuminant (not illustrated) is in each case assigned to each of the light exit areas 151-158 in the interior of the basic module 50. These illuminants can be controlled individually by a control electronics included in the basic module 50 and each cause a light exit from the corresponding assigned light exit area 151-158. The illuminants are arranged in the interior of the basic module 50 in such a way that an illuminant only emits light through the corresponding assigned light exit area 151-158 of the basic module 50. This means that the different illuminants, which are assigned to the different light exit areas 151-158, are optically isolated from one another in the interior of the basic module.

The sensor elements 91, 92, which accordingly include the infrared transmitter 93 and the infrared receiving sensor 94, can furthermore be seen on the front side 51 of the basic module 50. The sensor elements 91, 92 are encased in cylindrically formed protrusions, which are part of the housing 59 of the basic module 50.

The infrared transmitter 93 is arranged in the small cylindrical protrusion 57 and the infrared receiving sensor 94 is arranged in the large cylindrical protrusion 58. In the case of the illustrated embodiment, the basic module 50 additionally has further light exit areas 161-164 on a top side 55.

The side wall 53 or the opposite side wall 54 of the housing 59 of the basic module 50 can also have further light exit areas. Further light exit areas can likewise be provided on a bottom side 56.

Alternatively or in addition to the further light exit areas 161-164 on the top side 55, on one of the side walls 53, 54 or on the bottom side 56 of the housing 59 of the basic module, plug-in contacts 205 for a functional module, for example, a freely programmable display, such as, for example, a backlit LCD display or OLED display or the like can be arranged. The basic module 50 further has, for example, on the bottom side 56, connecting contacts 47, via which the basic module 50 can be connected to other transportation vehicle components from an information technology perspective, as well as be supplied with electrical energy. Alternatively or in addition, an optical interface for an optical information connection can be provided. The connecting contacts for an information technology connection to other transportation vehicle components and the energy supply can be formed separately and can also be formed on the rear side or another wall of the housing. An arrangement on different walls of the housing is possible.

In addition to the functional recesses 101 and 102 for accommodating the small cylindrical protrusion 57 and the large cylindrical protrusion 58, the light guiding module 60 has the information areas 71-78, which are formed via recesses 111-118. The recesses 111-118 are formed in such a way that light irradiated into one of the recesses 111-118 does not radiate in one of the other recesses 111-118. The recesses are optically isolated from one another. The material, in which the recesses are formed, is, for example, opaque.

In the case of the illustrated embodiment, the basic module 50 is embodied to be so compact that a front side 51 of the basic module is significantly smaller than that area, across which the information areas 71-78, which are defined by the recess 111-118, extend.

In the case of the illustrated embodiment, only the information areas 71, 72 can be directly backlit accordingly by light exiting from the light exit areas 151, 152. The light exiting from the other light exit areas 153-158 is guided to the assigned information areas 73-78 via light guide elements, which are formed in the light guiding module 60. The individual light guide elements, which are illustrated section by section in FIGS. 5 and 8 and which are identified with reference numerals 243-248, are hereby optically isolated from one another, so that the light, which exits from one of the light exit areas 153-158, is in each case guided via the assigned light guide element only to the correspondingly assigned information area 73-78, i.e., into the corresponding recess 113-118.

The decoupling of the light exit areas 151-158 of the basic module from the actual backlit information areas 71-78 creates a large flexibility. Identical basic modules can thus be combined with different light guiding modules and light shade units, which can be individually adapted in a corresponding manner to different body shapes. A number of the information areas formed in the light guiding module can also vary. Embodiments are possible, in the case of which none of the information areas is backlit directly without interpositioning a light guiding element.

This facilitates an installation in a transportation vehicle, because an available required installation depth for accommodating the transportation vehicle trim across a large surface of the transportation vehicle trim can be small and needs to be slightly larger only in the area, in which the basic module is arranged. The basic module can, for example, be installed in a transportation vehicle door in an area, in which, due to the design, the transportation vehicle door has a large depth due to the possibility of accommodating door lock and window pane, while the transportation vehicle door can taper significantly with regard to the depth towards an upper edge, in the extreme case up to the material thickness of the light shade unit of the transportation vehicle trim.

In the case of some disclosed embodiments, in particular, those which do not have an input unit for a user interaction, the basic module can be arranged so as to be shifted to the outer surface of the light shade unit.

The further light exit areas 161-164 may be coupled directly or via further light guiding elements to further backlighting areas.

They do not have an information element or symbol element and convey information to the user only via the backlighting per se or a color, intensity, temporal dynamic of the backlighting etc. (intensity, color change, duration of the backlighting, etc.). The further backlighting areas 361-364 can, for example, be arranged jointly in a row between the information areas 71-78 and can optically draw an attention of the user via a systematic control. For example, in that a wandering light point is created via selective turn on and turn off. Further light exit areas for backlighting the further backlighting areas can also be arranged on the front side of the basic module in addition to the light exit areas, which backlight the information areas.

In the illustrated embodiment, a symbol element 81-88 is provided in each information area 71-78. The symbol element may be formed in a material layer, which overlaps the corresponding recess 111-118 of the corresponding information area 71-78 and has opaque and transparent areas. The transparent areas can be formed, for example, as openings through an otherwise opaquely formed material layer. A shape of the transparent areas then determines the information, which can be recognized in response to the backlighting.

Alternatively, an information element can be formed in that a transparent material layer is quasi covered with the inverse information, for example, as an opaque color layer. The latter can, for example, be imprinted or can be sprayed on by using a mask. Alternatively again, a completely opaque layer, which can be a through-colored material layer or a color layer, can be locally removed or broken through by a laser.

The transparent material layer can also be the material in the widow area of the light shade unit, which, on the rear side, is provided with an opaque coating, in which the symbol elements or information elements are formed.

In the case of some disclosed embodiments, it can be provided that a film, in which the individual information elements are formed, is placed or inserted into the light guiding module. A simple individualization of the light guiding modules of a series production becomes possible through this, so that individual embodiments can have different information elements, depending on the equipment of the transportation vehicle, for which the transportation vehicle trim or the light guiding module, respectively, is provided.

In addition to the information areas 71-78, which are formed via the recesses 111-118, the light guiding module can have further backlightable recesses 131-134, which are coupled to the further light exit areas 161-164 on the top side 55 of the basic module 50, for example, via second light guide elements, which are again optically isolated from one another, when the basic module 50 is arranged with its front side 51 on the rear side 62 of the light guiding module 60.

Figure 4:
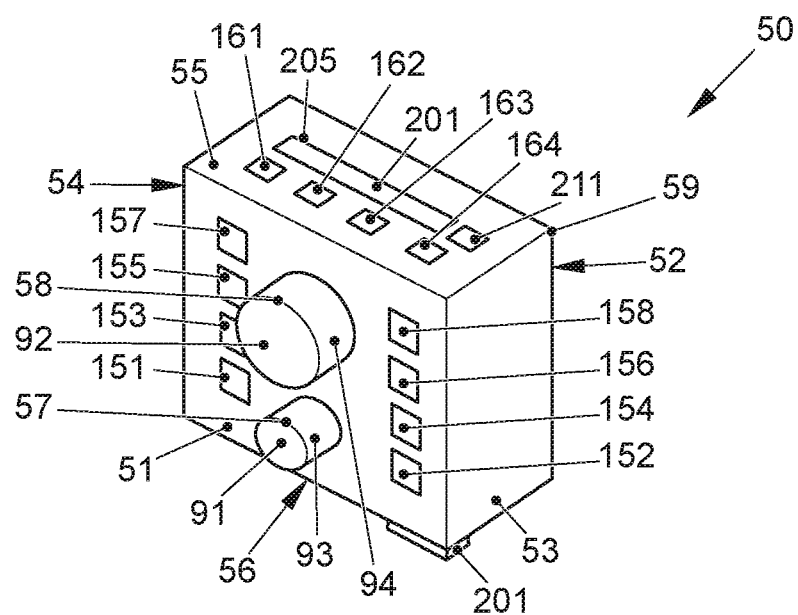
FIG. 4 shows a schematic view of a basic module.

A perspective view of a basic module is illustrated schematically in FIG. 4. Identical technical features are provided with the same reference numerals in all figures. A plug-in connector 201 for an information technology coupling to other transportation vehicle systems as well as for the energy supply of the individual functional units, such as illuminants, infrared detecting sensor, etc., in the basic module 50, can be seen in the case of this disclosed embodiment.

In the case of some disclosed embodiments, the basic module has an air exchange element 211, which comprises, for example, a membrane, which does in fact provide for a gas exchange, but prevents a penetration of moisture into the interior of the basic module 50. Air exchange or ventilation units of different designs can also be integrated into the housing 59 of the basic module 50. However, embodiments, in the case of which the housing, which may be made of thermoplastic synthetics, is completely welded thermally, may be beneficial. This is possible when the hollow spaces in the interior can be designed to be small and the electronics included in the basic module is embodied in such a way that a heat dissipation via the housing wall is possible in a reliable manner. In the case of individual disclosed embodiments, a heat conducting element can be integrated in the housing wall of the basic module for these purposes.

Figure 5:
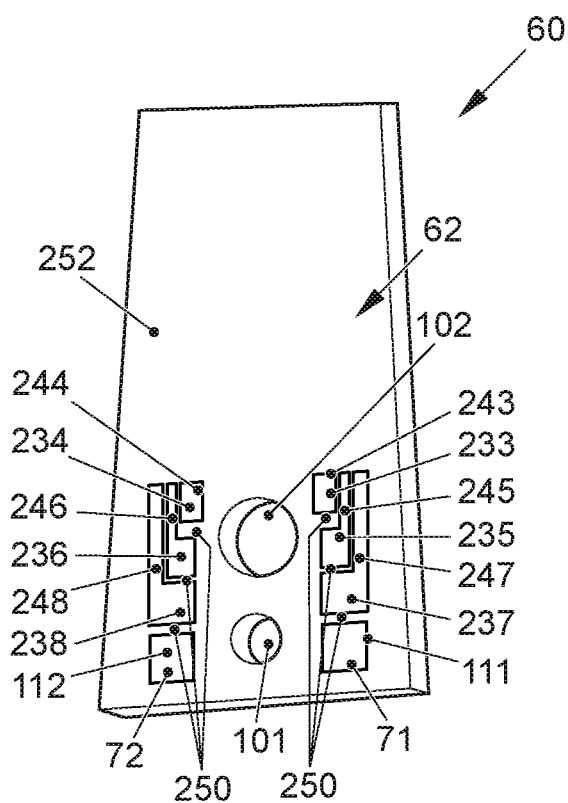
FIG. 5 shows a schematic rear view of a light guiding module.
Figure 6:
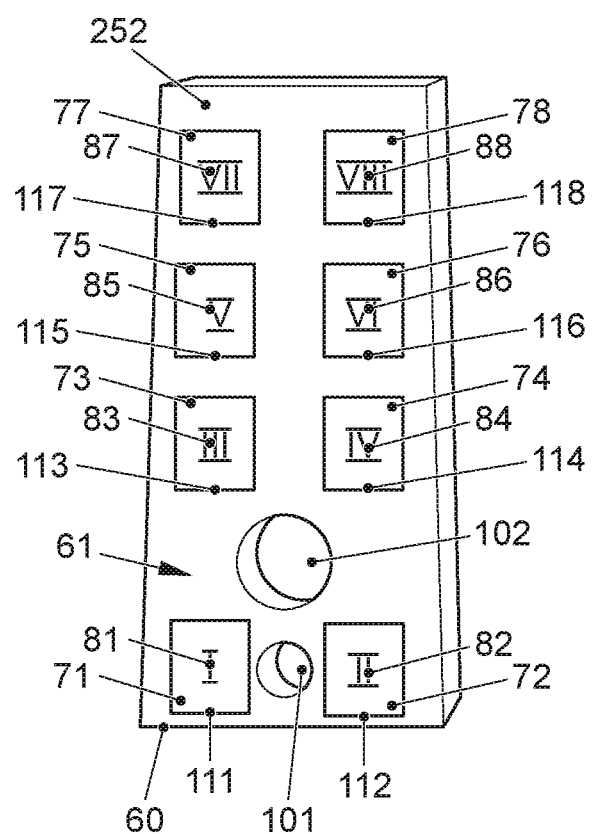
FIG. 6 shows a schematic front view of a light guiding module.

A view of a rear side 62 of the light guiding module 60 and of a front side 61 of the light guiding module 60 are accordingly illustrated schematically in FIG. 5 and FIG. 6. In the bottom area of the rear side, the recesses 111, 112 can be seen as information areas 71, 72, which can each be backlit directly by light exiting from a light exit area of a basic module. Light coupling areas 233-238 of the light guide elements 243-248 can further be seen. They are optically isolated from one another by opaque webs 250 of the light guiding module 60. As can be seen from FIG. 5, the light guides 243-248 are covered on the rear side 62 by an opaque material, at least in that area 252, in which the information areas 73-78 are formed in the front side.

In the illustrated embodiment, the light guiding elements 243-248 are covered opaquely everywhere where they are not covered by the basic module 50. It can hereby be ensured that the information or symbol elements, which are formed in the recesses 113-118, cannot be recognized, provided that light is not coupled into the corresponding light guiding element 243-248 in the coupling area 133-138 thereof.

In the case of another disclosed embodiment, at least some recesses, which, in the case of an arrangement of the basic module on the rear side of the light guiding module, are not covered by the latter and are arranged adjacently to the top side of the basic module, are neither covered by opaque material nor equipped with a light guide, so that a display attached to the basic module creates the information, which is to be displayed in the corresponding information areas. In the case of such a disclosed embodiment, other recesses can additionally also be coupled to the basic module via a light guide element. Such an embodiment is described below in connection with FIG. 9.

The individual symbol elements 81-88 of the information areas 71-78 can be seen in the front view of the light guiding module 60, which is illustrated in FIG. 6. The term symbol element and information element are used synonymously in this description. The symbols, which can be recognized in response to a backlighting, are illustrated here as Roman numerals "I" to "VIII," for example, for reasons of simplicity. The contours of the letters are openings of the opaque material of the light guiding module 60, which overlaps the recesses 111 to 118, for example, in each case on a front side.

If a light guiding module, which is produced in a large quantity, is used in transportation vehicles, which do not use all symbol elements or information areas or backlighting areas, individual ones of those information areas (symbol elements) can, for example, be masked with opaque material.

Figure 7:
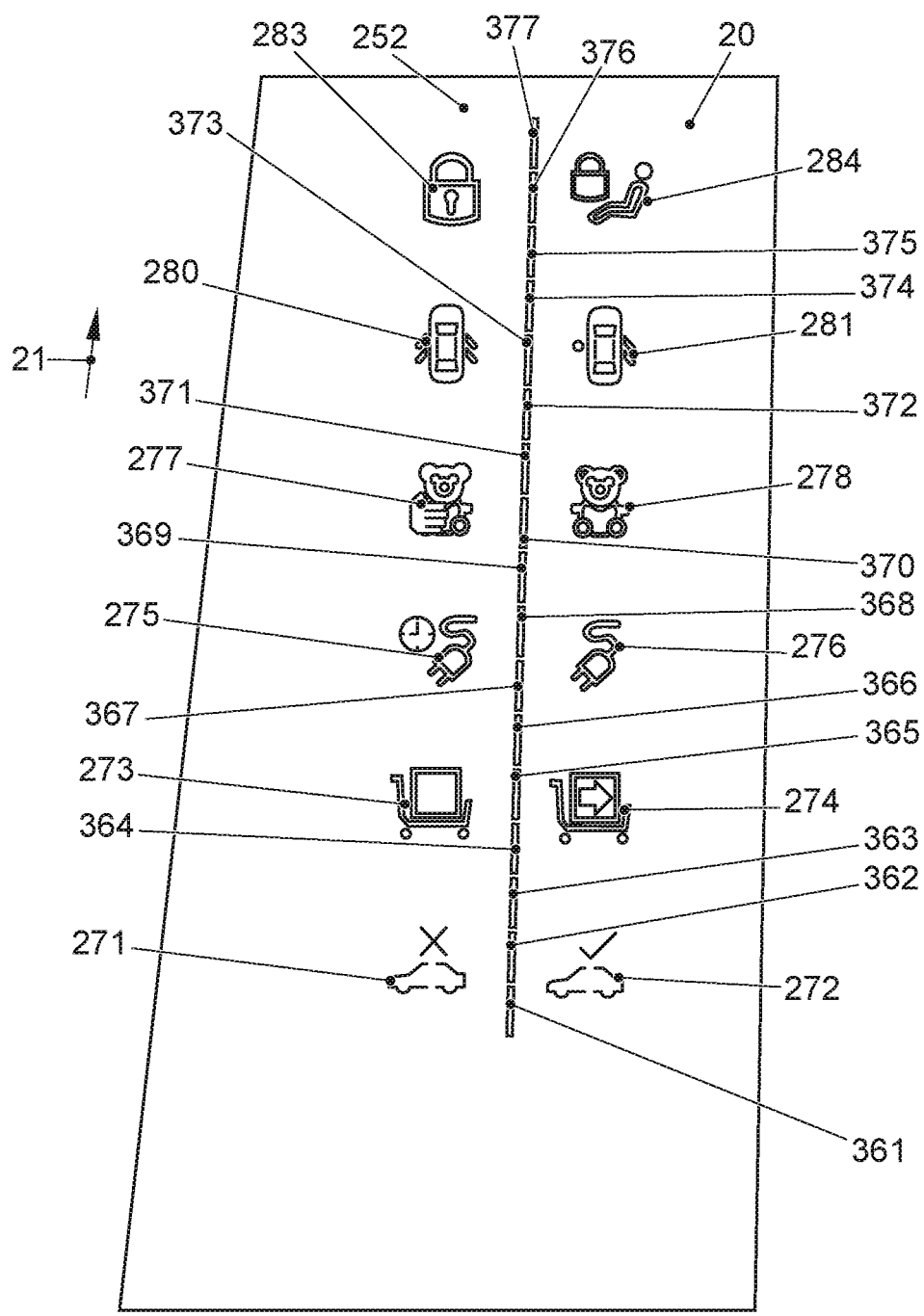
FIG. 7 shows a schematic top view onto a transportation vehicle trim with an illustration of symbols, which can be backlit in different information areas.

A schematic top view onto a transportation vehicle trim 20 is illustrated in FIG. 7, in the case of which, for visualization, all information areas are backlit for displaying the various information elements. The individual information areas 271-284 are arranged on top of one another in pairs, i.e., along a longitudinal direction 21 of the transportation vehicle trim. In the case of this disclosed embodiment, a window area 35, in which the information areas 271-284 are formed, extends virtually across the entire longitudinal direction 21 of the transportation vehicle trim 20. Further backlighting areas 361-377 are arranged between the information areas 271-284, which are arranged in pairs.

They can be used to draw an attention of a user to a certain area of the light shade unit 30 in response to a backlighting. This can take place, for example, in that a dynamically moving light point is created in that the illuminants used for the backlighting are turned on and off successively one after the other. The differently illustrated information elements 271-284 are assigned to different transportation vehicle functions and functionalities. The information areas 271, 272 specify, whether or not a user can pair his mobile telephone with the transportation vehicle. The information areas 273, 274 specify, whether or not goods are placed into the trunk of the transportation vehicle. The information areas 275, 276 relate to an electrical charging of energy storage systems of the transportation vehicle and are linked to a time-delayed or an immediately occurring charging. The information areas 277, 278 are linked to a detection functionality for objects, which comprise, for example, an RFID element, and display, whether objects provided with an RFID element are detected as being located in the transportation vehicle or are not detected. The remaining four information areas are linked to the opening of doors or the locking of the transportation vehicle, respectively.

It goes without saying that only exemplary symbols and exemplary transportation vehicle functions for the information areas are illustrated here. In addition to symbols, alphanumerical information can be displayed as well.

The illuminants, which backlight the information areas individually and systematically, may be formed in such a way that they can create differently colored light. Each information area may be backlit alternatively in red, green or blue, for example, in a controlled manner. For example, an activation of the function, which is linked to the corresponding information element/symbol element, can be indicated via a green backlighting, a deactivation accordingly via a red backlighting. A change between the activation and deactivation can be indicated, for example, via a blue backlighting, which is, for example, additionally embodied so as to blink, to indicate the dynamic changing operation. It goes without saying for the person of skill in the art that backlightings of different colors, in particular, of mixed colors, which can be created by color addition of the primary colors red, green and blue, are possible as well. A brightness of the backlighting and also a dynamic with regard to brightness, color, turn on and turn off, etc. can further be designed freely for each of the information elements, to control an information conveyance to an observer.

Figure 8:
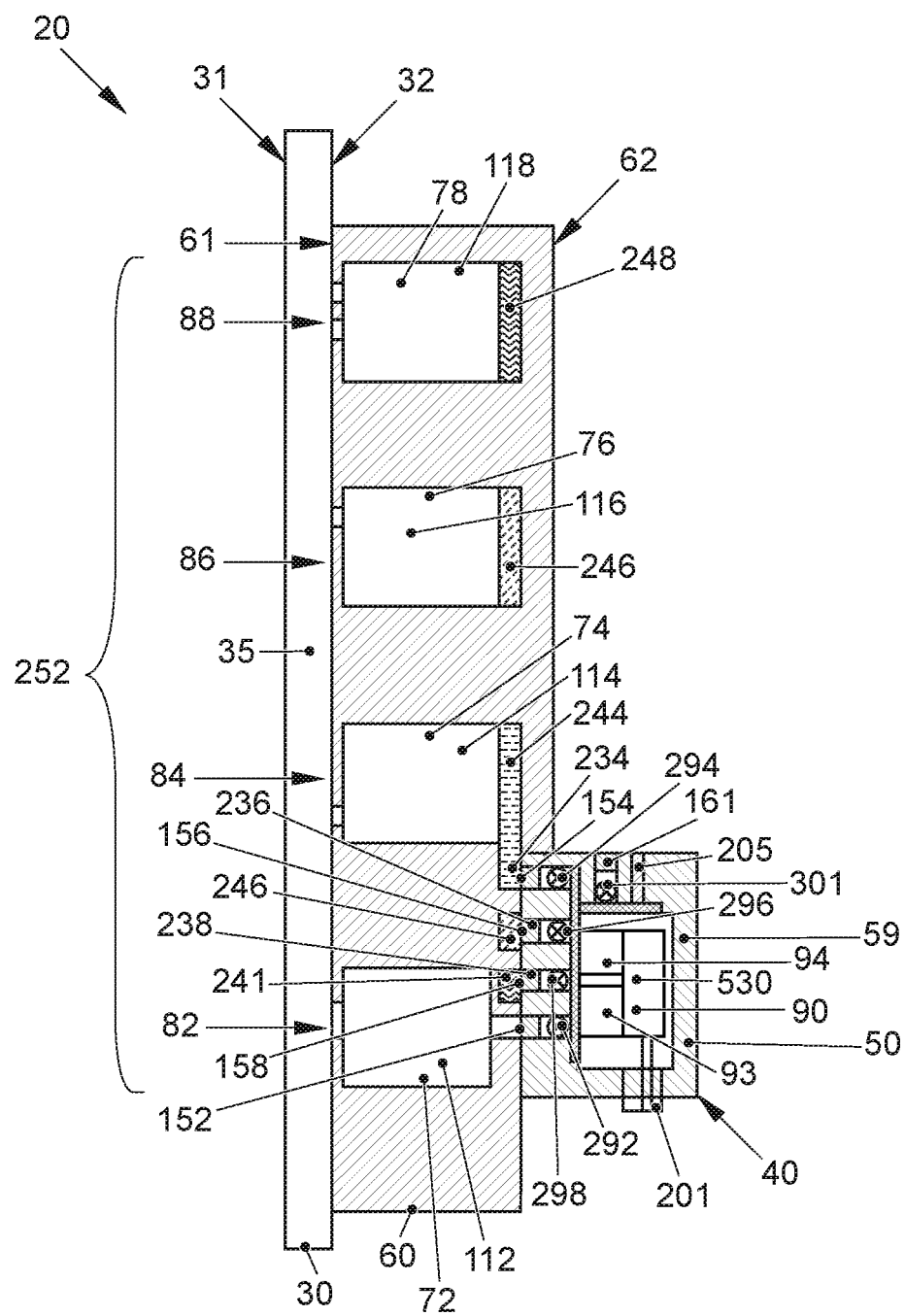
FIG. 8 shows a schematic sectional view through a transportation vehicle trim.

A schematic sectional view through a transportation vehicle trim 20 with display functionality and user interaction is illustrated in FIG. 8. Dimensions of the individual elements are not realistic. A surface of the front side 51 of the basic module 50, however, is smaller than an area 252, across which the information areas 72-78 extend. The light shade unit 30 as well as the basic module 50, which is encapsulated in a water-tight manner and which comprises all of the functional elements of the transportation vehicle trim 20, can be seen. The light guiding module 60 is arranged therebetween. The individual information areas 72, 74, 76, 78, which are formed via recesses, as well as the corresponding light guiding elements 244, 246, 248, can be seen well. An assignment of the coupling areas 234, 236, 238 to the light guiding elements 244, 246, 248 in the corresponding recesses are indicated via the shading. The individual illuminants 292, 294, 296, 298 in the basic module 50 are in each case optically shielded from one another in the basic module and emit light across the assigned light exit area 152, 154, 156, 158. The infrared transmitter 93 and the infrared receiving sensor 94 can also be seen schematically. The latter is, for example, formed in such a way that it can simultaneously detect infrared radiation, which is reflected back to the infrared receiving sensor 94 from different spatial directions via an optical system, via a number of sensor units. For example, the space upstream of the transportation vehicle trim is thus analyzed in an array, which comprises 31×31 areas, with regard to the presence of operating elements. A distance of a reflecting operating element (object), which may be present, as well as a corresponding reflection intensity is determined for the individual spatial directions. For this purpose, the infrared transmitter 93 may be operated in a pulsed manner. The distance can be determined from a signal propagation time of the infrared radiation and/or the reflection intensity, among others.

Static and/or dynamic gestures are evaluated by the determined distances and/or intensities for the different spatial directions upstream of the sensor, and are used to control the functionality. A control, which evaluates the gestures and controls the illuminants as well as creates signals to other transportation vehicle components, can be embodied in the basic module or can be implemented in a control device, which is coupled to the transportation vehicle trim 20. However, the electronic controls for the illuminants 292-298 as well as for the gesture recognition sensor 90 are included completely in the basic module.

Figure 9:
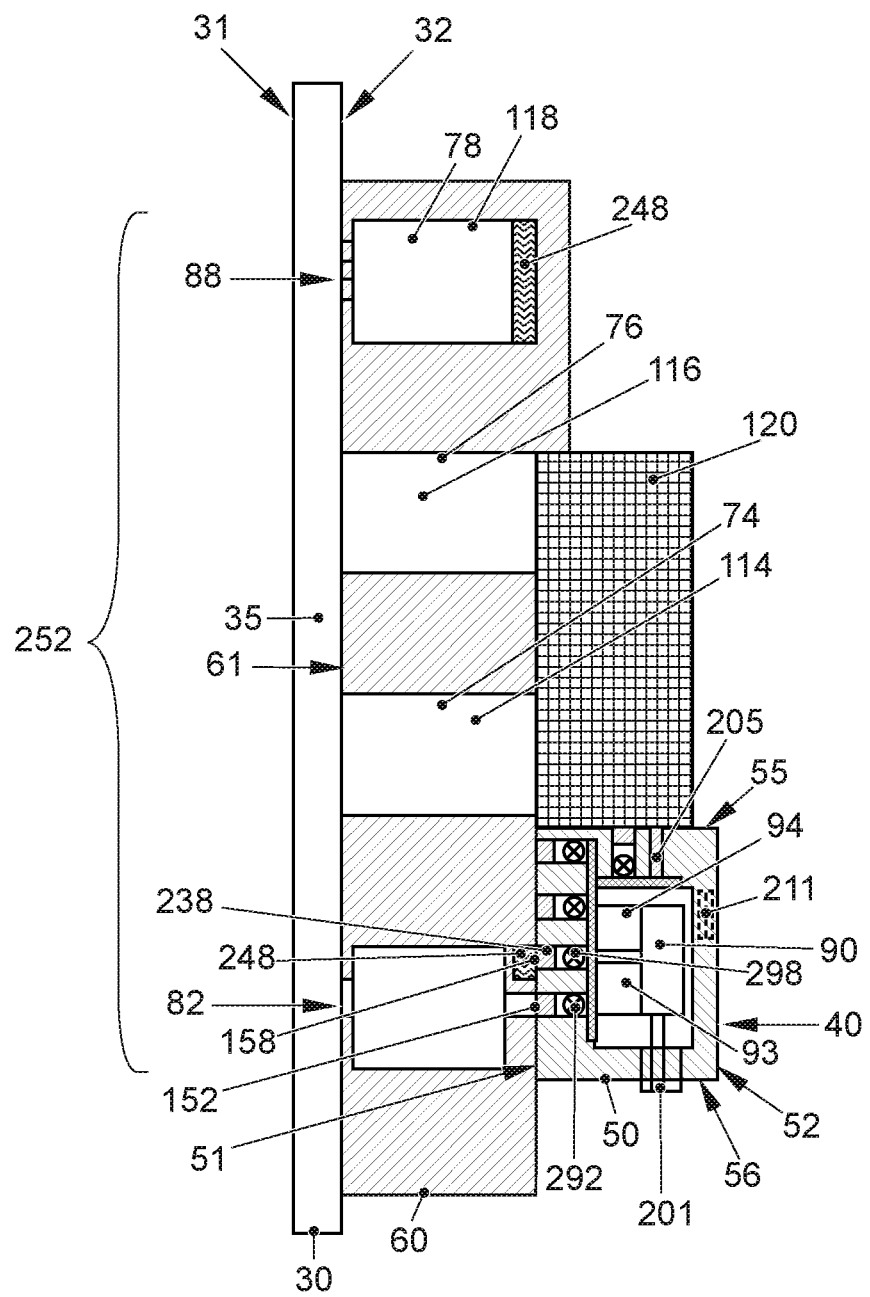
FIG. 9 shows a schematic sectional view, in which a part of the information areas is backlit by a display.

FIG. 9 shows a schematic sectional view similar to that according to FIG. 8. As already mentioned above, several recesses 84, 86 are backlit directly by a display 120 or screen, which is embodied to be water-tight and which is attached to the basic module 50 in the case of this disclosed embodiment.

The recesses 84, 86 in the light guiding module 60 are thus neither formed with a light guiding element, nor covered from behind. The display 120, which is arranged downstream from the rear side 62 of the light guiding module 60, can thus display the information in the assigned information areas 74, 76. A very high flexibility with regard to the displayable information is attained thereby.

In the case of the shown embodiment, an information area 78 is still coupled via a light guiding element 248 to an illuminant 298 of the basic module and is backlit by the illuminant. In addition, the information area 72 is backlit directly.

Other embodiments of the direct backlighting and/or the backlighting carried out via a light guiding element are missing.

In the case of the shown alternative of FIG. 9, the basic module is formed identically to that according to FIG. 8. It would also be possible, however, to save non-required illuminants.

The illuminants 292-298 as well as a further illuminant 301, all of which may be formed as multi-color LEDs, for example, RGB-LEDs, can be seen well in FIGS. 8 and 9. Alternatively, a number of illuminants, which create, for example, differently colored light, can in each case be assigned to each light exit area 152-158, 161.

Figure 10:
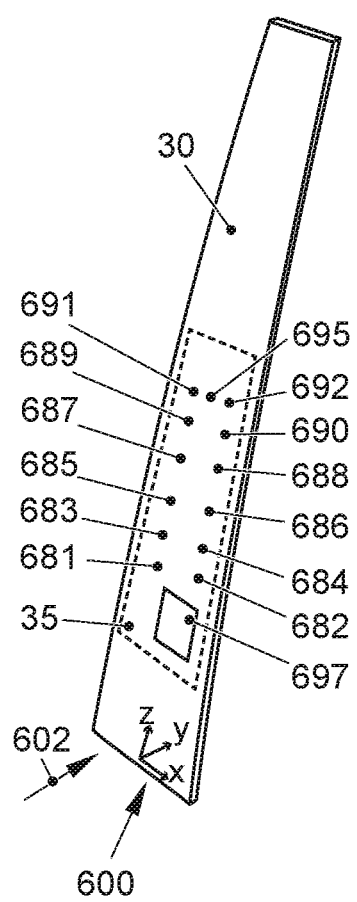
FIG. 10 shows a schematic perspective view of a viewing side of a light shade unit comprising an opaque coating on the rear side facing away from the viewing side.
Figure 11:
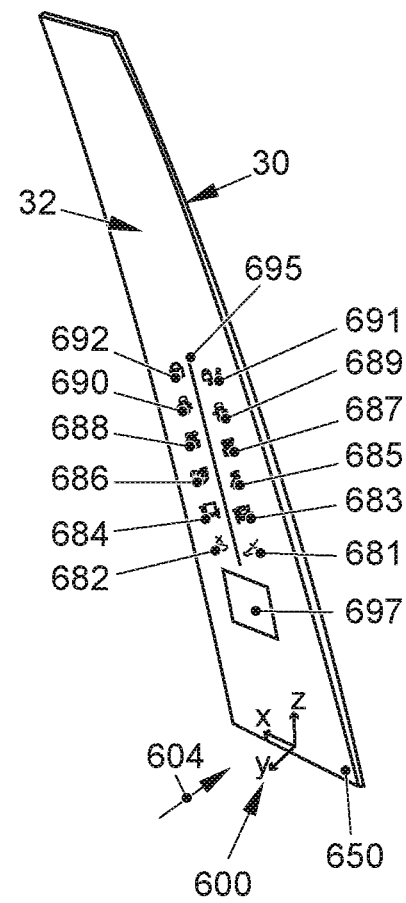
FIG. 11 shows a schematic perspective view of a rear side of the light shade unit according to FIG. 10 facing away from the viewing side.

A perspective illustration of a light shade unit from the viewing side is illustrated in FIG. 10. FIG. 11 shows the corresponding rear side of the light shade unit according to FIG. 10. The light shade unit extends essentially in an x-z plane, as follows by a coordinate system 600. The light shade unit 30 is viewed in positive y-direction 602. On the rear side 32, the light shade unit, which is otherwise transparent for visible light at least in a window area 35 for a transillumination along the negative y-direction 604, is provided with an opaque coating 650.

A weakening of the visible and or infrared light can take place in the material of the light shade unit, which is transparent for the transillumination. A noteworthy diffuse scattering, however, does not take place. For infrared light, the material light shade unit is transparent, possibly except for the opaque coating, optionally in both directions 602, 604.

The information elements 681-692, which are formed by recesses in the opaque coating 650, can be seen well. A center aperture 695 is provided to let through the light, which exits from still further recesses of a light guiding module, which is to be connected.

A sensor aperture 697 is provided so that the infrared radiation of a gesture recognition sensor is transmitted through the light shade unit 30 so as to be weakened as little as possible.

The information elements 681-692, the center aperture 695, and the sensor aperture 697 can be seen in FIG. 10, because a bright background or a light source is assumed behind the light shade unit, so that a transillumination of the light shade unit 30 or of the opaque coating 650, respectively, takes place on the rear side 32 thereof.

Figure 12:
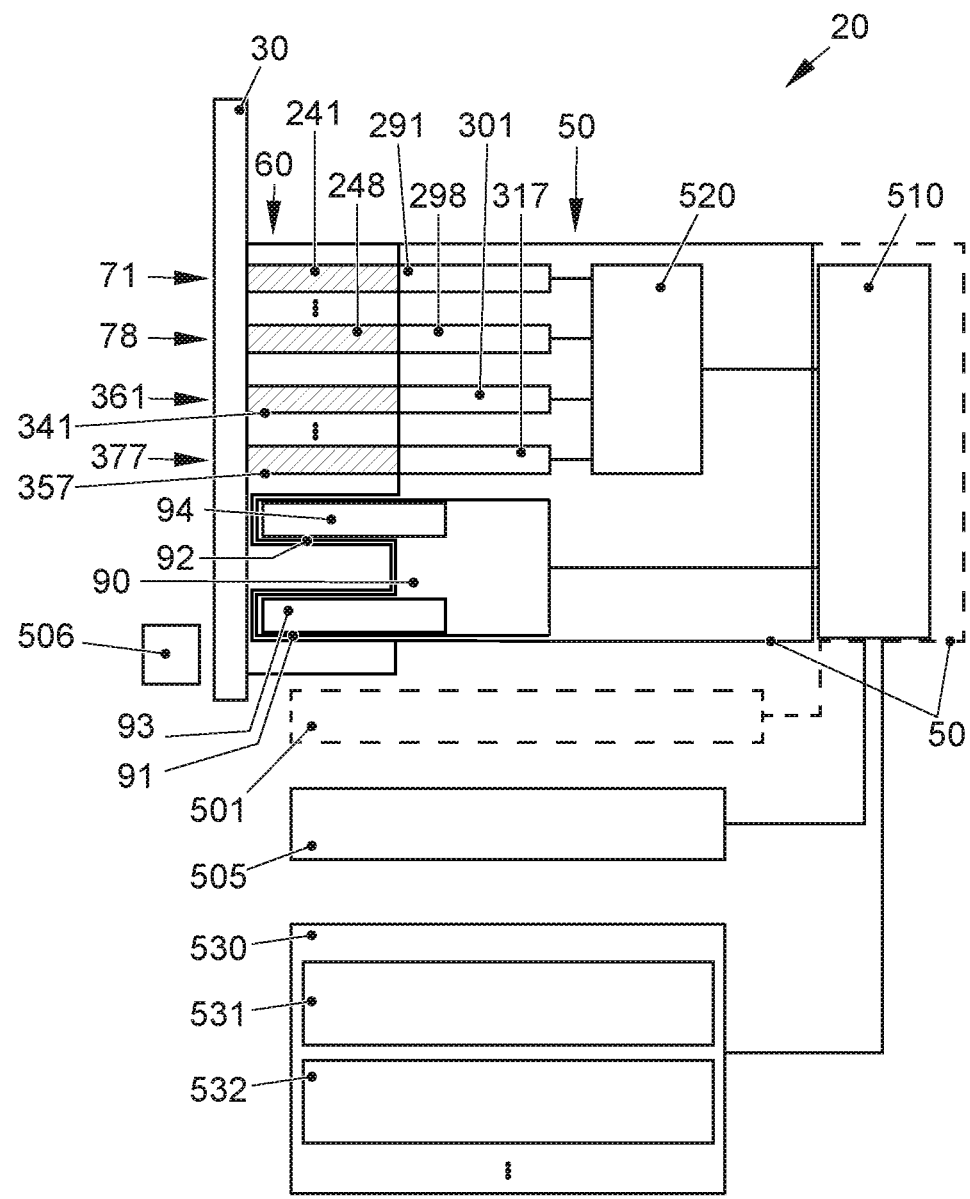
FIG. 12 shows a schematic illustration of the functional units.

A schematic illustration of the functional components is illustrated in FIG. 12, which components interact with one another in response to a use of the transportation vehicle trim 20 with display functionality and gesture control. In a basic operation, the gesture recognition sensor 90 is used as proximity sensor. Alternatively, another proximity sensor 501 can be used to recognize the approach of a user to the transportation vehicle trim 20. If the approach of a user to the transportation vehicle trim 20 is recognized, an authentication unit 505 is activated, which verifies the presence of a transportation vehicle key 506, which belongs to the corresponding transportation vehicle, in which the transportation vehicle trim 20 is installed, for example, via a wireless communication in a so-called challenge-response process. The authentication of an authorized user can also be carried out in any other manner by the authentication device 505. If the approach of an authorized, i.e., authenticated user to the transportation vehicle trim 20 has been recognized, the complete activation of the gesture recognition sensor 90 and usually additionally of one of the illuminants 291-298 is controlled by a function control unit 510, which can be integrated in the basic module 50 or can be formed separately from this basic module 50, to provide a user with a response that an interaction with the transportation vehicle trim 20 or with the gesture recognition sensor 90, respectively, is possible via a gesture. The further backlighting areas 361-371, which are connected to still further illuminants 301-317 via still further light guiding elements 341-357, can, for example, be activated individually or jointly, as has already been mentioned in connection with FIG. 3.

Transportation vehicle equipment 530, such as the central lock 531, a charging unit 532, etc. can be operated via gestures by the functional control unit 510.

To convey the possible functionalities, which the system provides and which can be operated via a gesture, to the user, all information areas are backlit, for example, in blue color or an assigned information area is backlit for each functionality, respectively, in the case of at least one disclosed embodiment, to convey the current status information of the system to the user. If a gesture is detected via the gesture recognition sensor 90, for example, a swiping movement from left to right across two adjacently arranged information areas, which are assigned to a certain transportation vehicle functionality, a corresponding transportation vehicle system is controlled according to the recognized gesture, and the illuminants 291-297 are controlled in such a way via the functional control unit 510 and/or the illuminant control 520 that a corresponding response to the user of the function activation via a backlighting of the corresponding information elements or symbol elements, respectively, in the corresponding information areas is carried out. For example, an unlocking of the transportation vehicle can be displayed or it can be selected by the user, whether a charging of the electrical energy storage system is to take place immedicably or after a time delay. In addition to swiping gestures, the covering of an information area with an operating element, for example, a hand, can also be detected as gesture. A variety of embodiment options exist here.

If the gesture recognition sensor 90 is installed, for example, as part of the B-column trim in a front transportation vehicle door 2, the gesture recognition sensor can also detect an approach of a hand to a door opening element, for example, a door handle 12, so that a further sensor system, which detects an approach and/or operation of a door handle, can be saved as compared to transportation vehicles from the prior art. Sensors on the door handle 12 can be replaced by the gesture recognition sensor 90.

If the user leaves the detection area of the gesture recognition sensor 90 or if the key used for the authentication is removed from the detection area of the authentication sensor, the functional interaction with the user is ended. All or individual functionalities, for which information areas are provided in the transportation vehicle trim, can be deactivated, in particular, based on the verification as to whether a person, who has approached, is authenticated.

For a transportation vehicle, which is operated in car sharing, for example, it can also be provided, however, that information, which specifies whether a transportation vehicle is free or is already reserved by another user, is displayed permanently via a backlighting of one of the corresponding information areas or without verification of the authentication of the user, when a random person approaches. An authentication for the use of further functions can be provided in this case, for example, via a pairing with a mobile telephone and querying of authentication data via the mobile telephone. After a successful authentication, the further functionalities of the transportation vehicle can be controlled by the user via the gesture recognition sensor.

REFERENCE LIST 1 transportation vehicle
2 front transportation vehicle door
3 rear transportation vehicle door
4 tail gate
5 A-column
6 B-column
7 C-column
8-10 side windows
12 door handle
20 transportation vehicle trim with display functionality
21 longitudinal direction
30 light shade unit
31 viewing side
32 rear side
35 window area
40 functional unit
45 input unit
46 plug-in contacts
47 connecting contacts
50 basic module
51 front side
52 rear side
53 side wall
54 opposite side wall
55 top side
56 bottom side
57 small cylindrical protrusion
58 large cylindrical protrusion
59 housing
60 light guiding module
61 front side
62 rear side
71-78 information areas
81-88 information/symbol elements
90 gesture recognition sensor
91 sensor elements
92 sensor elements
93 infrared transmitter
94 infrared receiving sensor
101,102 functional recesses
111-118 recesses
151-158 light exit areas
161-164 further light exit areas
201 plug-in connector
205 plug-in contacts
211 air exchange element
233-238 light coupling areas
243-248 light guiding elements
250 opaque webs
252 area (in which information elements are formed)
271-284 information areas
291-298 illuminants
301-317 still further illuminants
341-357 further light guiding elements
361-377 further backlighting areas
501 other proximity sensor
505 authentication unit
506 transportation vehicle key
510 function control unit
520 illuminant control
530 transportation vehicle equipment
531 central lock
532 charging unit
600 coordinate system
602 positive y-direction
604 negative y-direction
650 opaque coating
681-692 information elements (symbol elements)
695 center aperture
697 sensor aperture

The invention claimed is:

1. A transportation vehicle trim with display functionality, the trim comprising:
a light shade unit comprising at least one window section having a plurality of transparent areas in the visible wavelength for transillumination of the at least one window section; and
a basic module comprising at least one illuminant, one input unit, and a self-contained, water-tight housing,
a light guiding module disposed between the light shade and the basic module, wherein the light guiding module comprises a plurality of optically isolated light guiding elements operating by total internal reflection to direct light from the basic module to the light shade,
wherein the at least one illuminant and the input unit are arranged within an interior of the self-contained, water-tight housing such that the basic module omits hollow spaces and is substantially comprised of solid synthetic material,
wherein the basic module is mechanically connected to the light shade unit, and
wherein the plurality of optically isolated light guiding elements extend out from the self-contained, water-tight housing into the light shade.

2. The transportation vehicle trim of claim 1, wherein the light guiding module has at least one recess for forming a backlightable information area, and wherein the at least one recess is overlapped by the window area comprising the plurality of transparent areas.

3. The transportation vehicle trim of claim 2, wherein the light guiding module has further recesses which form further information areas for a backlighting, the basic module has a plurality of light exit areas, to each of which an individually controllable illuminant is assigned, and wherein the plurality of optically isolated light guiding elements correspond to each of the individually controllable illuminants and are formed in the light guiding module to guide the light exiting from one of the light exit areas of the basic module to one of the information areas of the light guiding module.

4. The transportation vehicle trim of claim 2, wherein the light guiding module comprises recesses for accommodating sensor elements of the input unit.

5. The transportation vehicle trim of claim 4, wherein the light shade unit has a closed surface and, in the at least one window section having the plurality of transparent areas and which overlaps the sensor elements of the input unit, is transparent non-visible wavelength radiation, which is emitted and/or received by the sensor elements of the input unit.

6. The transportation vehicle trim of claim 3, wherein the basic module comprises at least one additional individually controllable illuminant, the light of which exits from an additional light exit area in response to a control, and wherein the light guiding module has at least one additional recess for forming at least one additional information area, wherein the at least one additional recess and the at least one additional light exit area overlap so the light exiting from the at least one additional light exit area directly backlights the at least one additional information area.

7. The transportation vehicle trim of claim 2, wherein the basic module and the light guiding module and/or the light shade unit are coupled such that the basic module is fastened to the light guiding module and/or the light shade unit by a detent connection.

8. The transportation vehicle trim of claim 2, wherein the basic module has at least one light exit area, from which the light of the at least one illuminant exits from the basic module, and the basic module is arranged on the light guiding module so the at least one light exit area does not overlap with the at least one recess, which forms the at least one information area for a backlighting, and at least one light guiding element is formed in the light guiding module, which guides the light from the at least one light exit area of the basic module to the backlightable at least one information area of the at least one recess.

9. The transportation vehicle trim of claim 8, wherein, on a side facing away from the light shade unit, the at least one recess and/or another plurality of recesses and the at least one light guiding element and another plurality of light guiding elements are in each case covered by opaque material.

10. The transportation vehicle trim of claim 1, wherein the input unit comprises a gesture recognition sensor which operates without contact.

* * * * *